(12) United States Patent
Ueno et al.

(10) Patent No.: US 6,696,133 B2
(45) Date of Patent: Feb. 24, 2004

(54) WIRING BOARDS AND PROCESSES FOR MANUFACTURING WIRING BOARDS

(75) Inventors: Yoshifumi Ueno, Kanuma (JP); Yukihiro Takikawa, Kanuma (JP)

(73) Assignee: Sony Chemicals Corp., Tokyo (JP)

( * ) Notice: Subject to any disclaimer, the term of this patent is extended or adjusted under 35 U.S.C. 154(b) by 61 days.

(21) Appl. No.: 09/969,641

(22) Filed: Oct. 4, 2001

(65) Prior Publication Data

US 2002/0041950 A1 Apr. 11, 2002

(30) Foreign Application Priority Data

Oct. 5, 2000 (JP) .......................... 2000-306523

(51) Int. Cl.[7] .............. H01B 7/08; B32B 3/24
(52) U.S. Cl. ............... 428/138; 174/36; 361/748; 29/868
(58) Field of Search ............... 428/138; 174/36; 361/748; 29/868

(56) References Cited

U.S. PATENT DOCUMENTS

| | | | |
|---|---|---|---|
| 4,209,215 A | * 6/1980 | Verma | .......... 439/497 |
| 4,288,916 A | 9/1981 | Verma | |
| 4,616,102 A | 10/1986 | Noorily | |
| 5,003,126 A | * 3/1991 | Fujii et al. | .......... 174/36 |
| 5,446,239 A | * 8/1995 | Mizutani et al. | .......... 174/36 |
| 5,455,383 A | * 10/1995 | Tanaka | .......... 174/36 |

FOREIGN PATENT DOCUMENTS

JP 06-176634 6/1994

* cited by examiner

Primary Examiner—William P. Watkins, III
(74) Attorney, Agent, or Firm—Oliff & Berridge, PLC

(57) ABSTRACT

In wiring board 1 of the present invention, a shield film 50 is connected to a specific wiring member (ground wiring) 17 at the bottoms of openings 14 in cover film 21 and the shield film 50 is wrapped from the side of cover film 21 to the side of base film 11. Therefore, shield film 50 can be placed at ground potential on not only the side of cover film 21 but also the side of base film 11, whereby wiring board 1 can be wholly shielded from the noise emitted from other electronic components. Ground wiring 17 is patterned to be wider than the other wiring members (signal wirings) 18, which allows a large current to pass and openings 14 to be made in a large diameter, so that cover film 21 can be easily aligned and more reliably connected to shield film 50.

6 Claims, 12 Drawing Sheets

WIRING BOARDS AND PROCESSES FOR MANUFACTURING WIRING BOARDS

FIELD OF THE INVENTION

The present invention relates to the field of flat cables, particularly to the field of flat cables shielded against electromagnetic waves.

PRIOR ART

Flat cables consisting of a plurality of parallel wirings have been widely used.

Reference 101 in FIG. 13 represents a conventional flat cable comprising a plurality of wirings 112 longitudinally arranged in parallel on an elongate base film 111. Ten wirings 112 are shown in this figure.

A cover film 113 is applied on wirings 112 except for both ends of wirings 112, so that the part of each wiring 112 covered with cover film 113 forms a signal member 122 and the parts at both ends of the member not covered with cover film 113 form terminal members 121.

In order to electrically connect electric circuits using this flat cable 101, terminal member 121 at one end of flat cable 101 is connected to one electric circuit and terminal member 121 at the other end is connected to the other electric circuit.

Each wiring 112 consists of a copper foil having a thickness of several tens of micrometers, and the wiring 112, base film 111 and cover film 113 are flexible so that flat cable 101 can be folded to connect electric circuits.

Flat cable 101 as described above has been used in various devices in recent years, which raised the problem that flat cable 101 picks up noises.

If flat cable 101 were wholly covered with a metal foil, the metal foil could serve as an electromagnetic shield but involve a complex operation for grounding the metal foil.

The present invention was made to overcome the disadvantages of the prior art as described above with the purpose of providing a technique for easily and reliably accomplishing the grounding operation in a process for preparing a wiring board with a shield film.

SUMMARY OF THE INVENTION

In order to solve the above problems, the present invention provides a wiring board comprising a base film, a plurality of wiring members provided on the base film and bonded to the base film, a cover film provided on the wiring members, an opening formed in the cover film to expose the surface of a specific wiring member of the wiring members but not expose the surfaces of the other wiring members, and a shield film wrapped to cover both of the side of the base film and the side of the cover film, wherein the shield film is connected to the specific wiring member at the bottom of the opening.

A wiring board of the present invention is characterized in that the specific wiring member of the wiring members is wider than the other wiring members.

A wiring board of the present invention is characterized in that a terminal member is connected at each end of the each wiring member and at least a part of the terminal member is exposed from the cover film so that the shield film does not come into contact with the exposed part of the terminal member.

A wiring board of the present invention is characterized in that the shield film comprises a resin film, a conductor layer provided on the resin film and a conductive adhesive layer provided on the surface of the conductor layer and the conductive adhesive layer is in close contact with the surface of the cover film and the surface of the base film.

A process for manufacturing a wiring board of the present invention comprises patterning a metal layer on a base film in a predetermined shape to form a plurality of metal wirings, providing a cover film having an opening on the metal wirings in such a manner that the opening overlies a specific metal wiring of the metal wirings, and wrapping a shield film from the side of the base film to the side of the cover film.

A process for manufacturing a wiring board of the present invention comprises providing a plurality of wiring sets consisting of the metal wirings on a predetermined region of the base film, forming the opening in the number equal to or greater than the number of the wiring sets in the cover film in such a manner that at least one opening overlies the each wiring set, providing the cover film on the metal wirings and then cutting the base film and the cover film to separate the wiring sets.

According to the present invention as defined above, a specific wiring member and a shield film are electrically connected at the bottom of an opening in a cover film and the shield film is wrapped from the side of the cover film to the side of the base film, whereby the shield film can be placed at ground potential on not only the side of the cover film but also the side of the base film.

Each wiring member consists of a metal layer patterned in a predetermined pattern and a specific wiring member is patterned to be wider than the other wiring members. Therefore, the specific wiring member is exposed at the bottom of the opening even if the opening made in a large diameter is positioned, and the opening can be easily aligned with the specific wiring member.

The part of the terminal member exposed from the cover film connected to each end of each wiring member is electrically exposed without contact with the shield film, whereby the terminal member can be easily connected to a connector of another electronic circuit.

The shield film comprises a resin film, a conductor layer and a conductive adhesive layer stacked in the order mentioned and is wrapped in such a manner that the conductive adhesive layer is in close contact with the cover film and the base film, whereby the shield film can be bonded to the surfaces of the cover film and the base film without applying an adhesive on the surfaces of the cover film and the base film or the surface of the shield film.

In the state where the shield film is wrapped, the resin film is located on the outside of the wiring board and the resin film protects the conductor layer, whereby no short circuit occurs even if the wiring board of the present invention comes into contact with another electronic component.

THE MOST PREFERRED EMBODIMENTS OF THE INVENTION

An embodiment of a wiring board of the present invention will now be explained together with a process for manufacturing it.

Figure 1A:
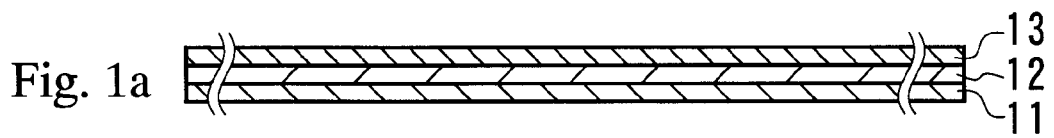
FIGS. 1(*a*)–(*e*) is a sectional view for illustrating the first half of the manufacturing process of a wiring board according to one embodiment of the present invention.

Referring to FIG. 1(a), reference 11 represents a base film comprising a resin film (here, a resin film made of polyethylene terephthalate), and an insulating adhesive layer 12 is formed on the surface of the base film 11. In order to prepare a wiring board, a metal layer 13 consisting of a copper foil having a thickness of about 35 $\mu$m is first applied on insulating adhesive layer 12 on the surface of the base film 11.

Figure 1B:
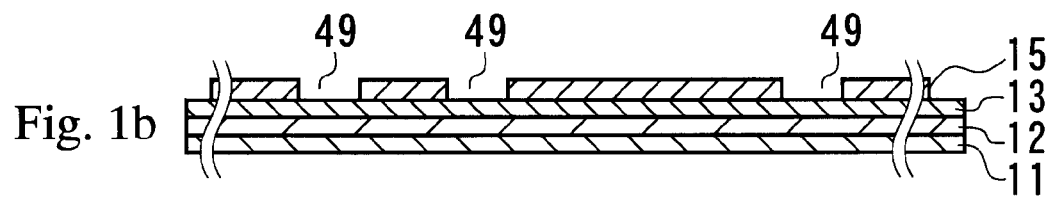

Then, a resist film 15 patterned in a predetermined shape is formed on the surface of metal layer 13 as shown in FIG. 1(b). Metal layer 13 is exposed at the bottoms of openings 49 in the resist film 15.

Figure 1C:
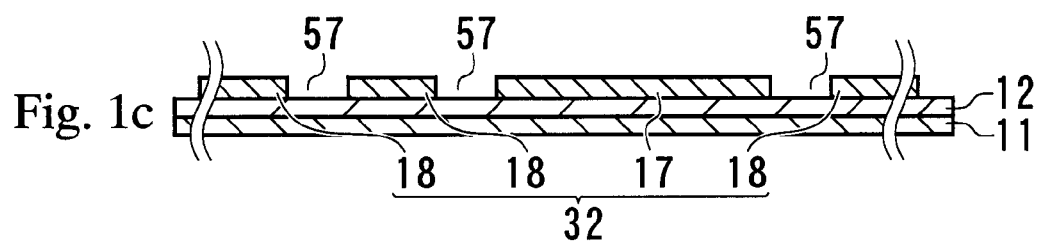

The assembly is immersed in an etching solution to etch off metal layer 13 exposed at the bottoms of openings 49 and metal layer 13 is patterned, and then resist film 15 is removed (FIG. 1(c)).

Figure 3:
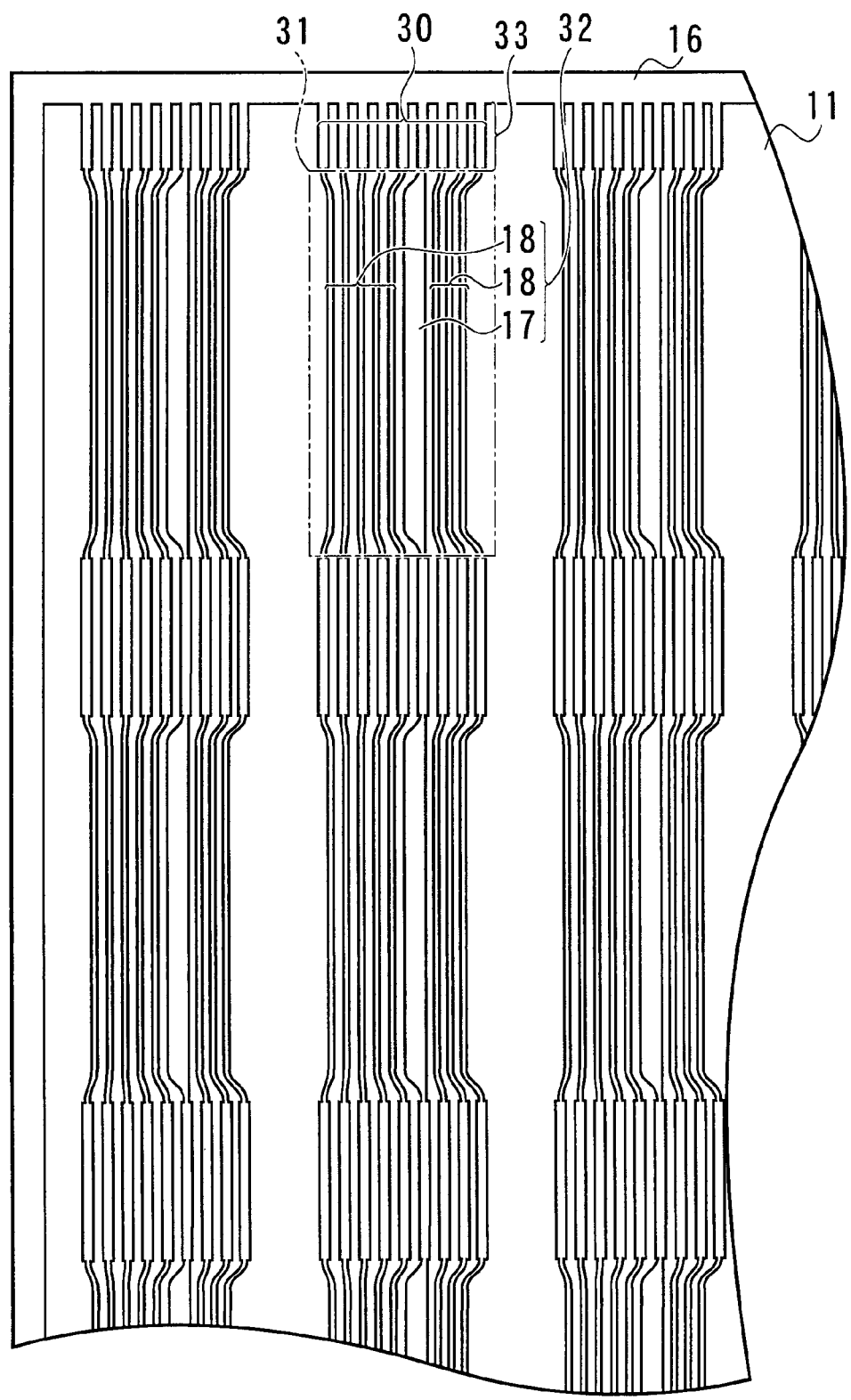
FIG. 3 is a plan view corresponding to FIG. 1(*c*).

FIG. 3 is a partial plan view of partial base film 11 in this state. On base film 11, metal layer 13 is patterned by etching to form a plurality of metal wirings 30.

Each metal wiring 30 comprises a plurality of connector members 33 and wiring members 32 for interconnecting connector members 33.

Wiring members 32 include two types, ie, a ground wiring 17 (specific wiring member) consisting of a wide part of metal wiring and signal wirings 18 (other wiring members) having a smaller width than that of ground wiring 17. Connector members 33 are formed in an approximately rectangular shape having a width smaller than that of ground wiring 17 but larger than that of signal wiring 18.

Figure 5:
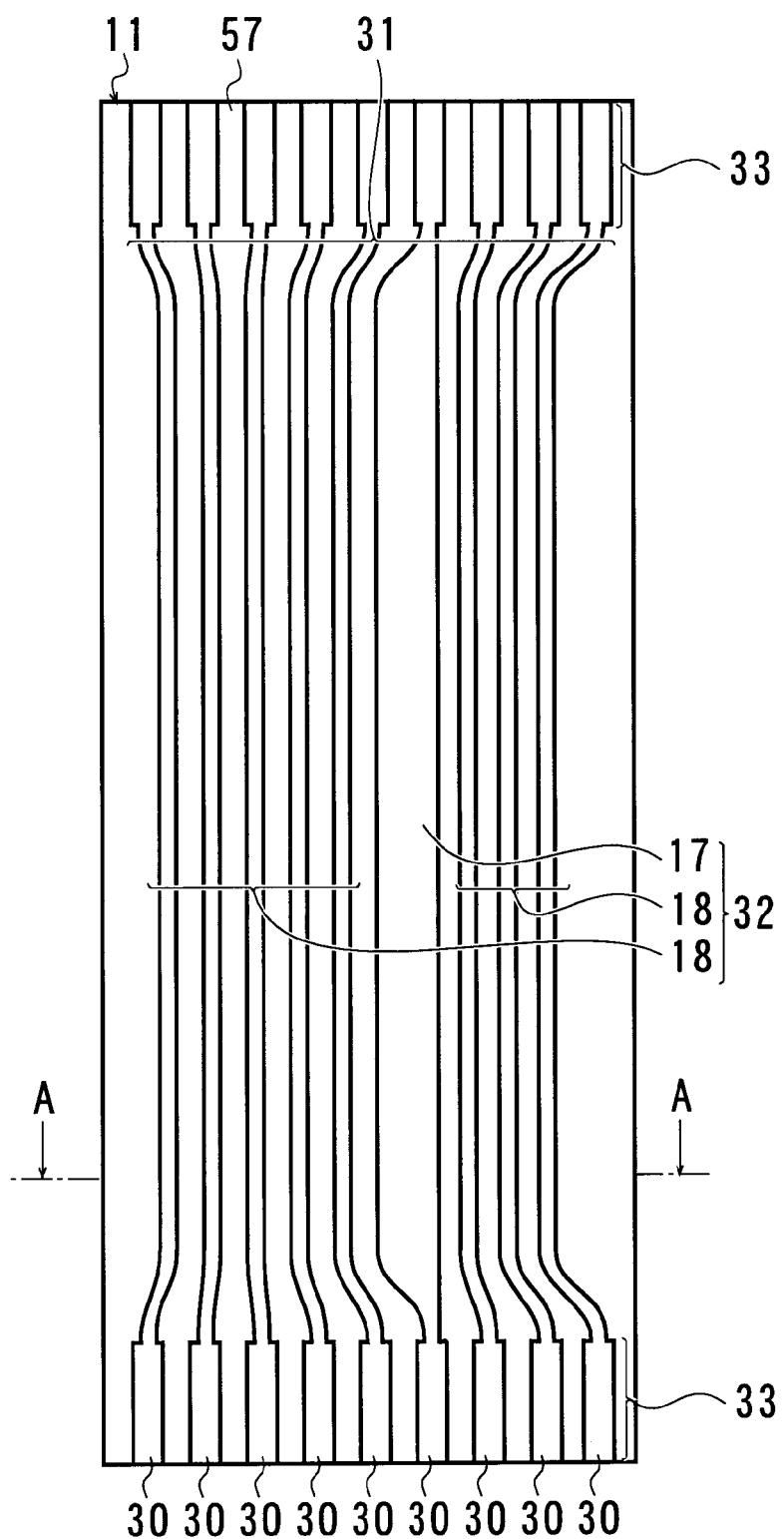
FIG. 5 is an enlarged plan view corresponding to FIG. 1(*c*).

A plurality of signal wirings 18 are gathered near one ground wiring 17 so that ground wiring 17 and signal wirings 18 closely gathered between connector members 33 form a wiring set 31 as shown in FIG. 3 forming a wiring board described later. FIG. 5 shows an enlarged plan view of the part where a wiring set 31 is formed on base film 11.

Here, a wiring set 31 is formed of a total of nine wiring members 32 consisting of one ground wiring 17 and eight signal wirings 18. Such wiring sets 31 are arranged in processions on base film 11.

Figure 1D:
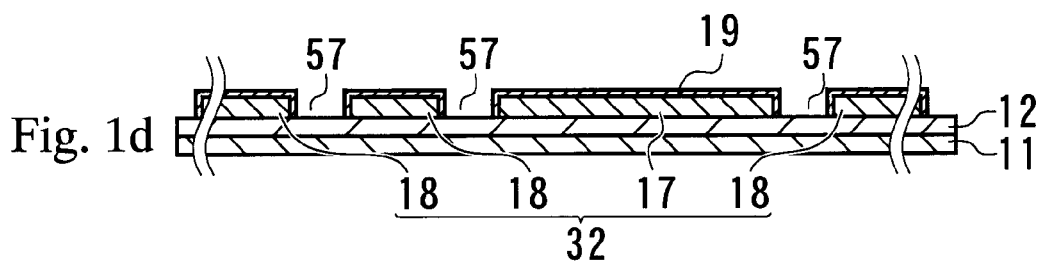

During etching metal layer 13 to form metal wirings 30, an electrode 16 is formed along with metal wirings 30 as shown in FIG. 3. Here, electrode 16 is provided on an edge of base film 11, and connector member 33 at an end of each metal wiring 30 is connected to electrode 16. Therefore, when the assembly is immersed in an electroplating solution and electrode 16 is connected to a power source to apply a voltage, the voltage is supplied to each metal wiring 30 to form metal coating 19 on the surfaces of wiring members 32 and connector members 33 of metal wiring 30 (FIG. 1(d)).

Next, a process for applying a cover film comprising of the same resin film as that of base film 11 on metal wiring 30 is explained.

Figure 1E:
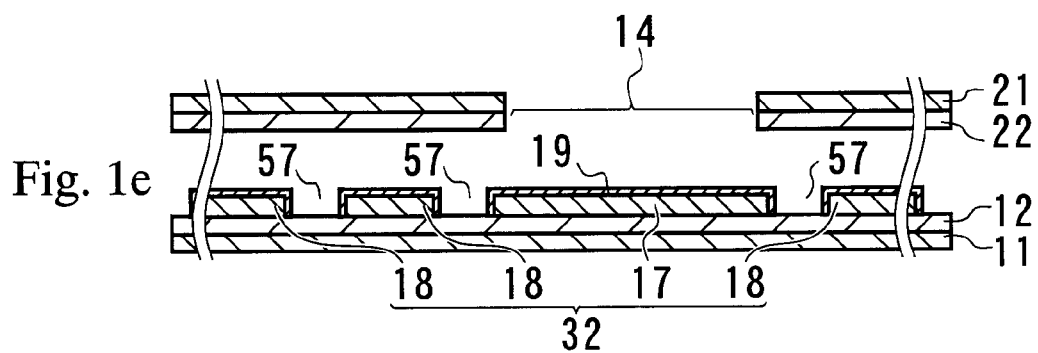

Reference 21 in FIG. 1(e) represents the cover film. An insulating adhesive layer 22 is formed on one side of the cover film 21.

A plurality of openings 14 and windows 27 penetrating from surface to bottom are formed in cover film 21 and insulating adhesive layer 22.

Figure 10:
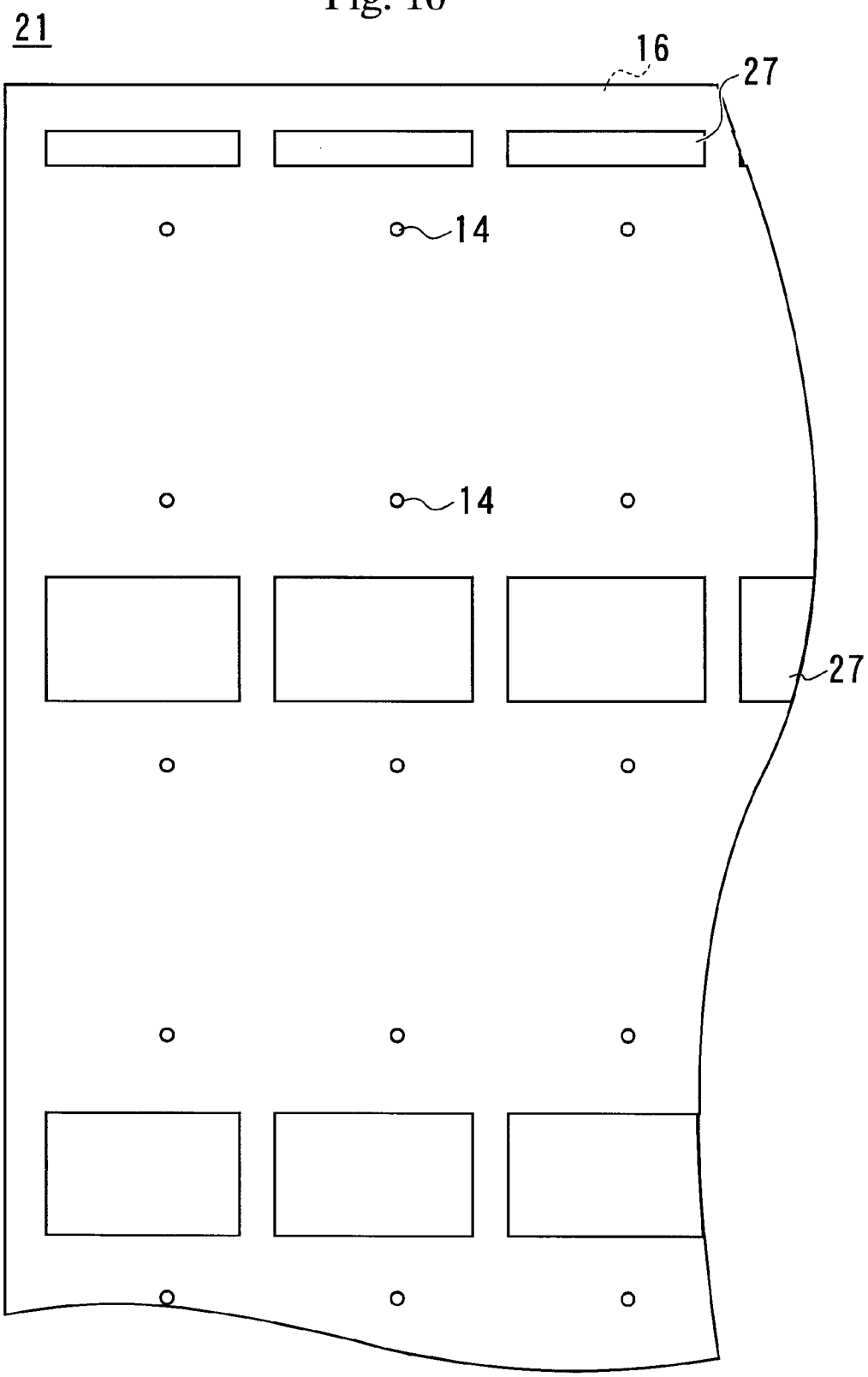
FIG. 10 is a diagram for illustrating a cover film used in a wiring board of the present invention.

A plan view of the cover film 21 is shown in FIG. 10. Windows 27 are rectangular and arranged in processions over cover film 21. Openings 14 are circular and arranged between opposed windows 27.

Cover film 21 and base film 11 each have an alignment mark not shown, which is used to align metal wirings 30 on base film 11 and insulating adhesive layer 22 on the surface of cover film 21 facing each other so that insulating adhesive layer 22 and metal wirings 30 are brought into close contact with each other.

Windows 27 in cover film 21 are formed at the locations corresponding to connector members 33 of each metal wiring 30, while openings 14 are formed at the locations corresponding to ground wirings 17. Therefore, windows 27 overlie connector members 33 and openings 14 overlie ground wirings 17, respectively, as shown in FIG. 4 after alignment using the alignment mark.

When the assembly is heated under pressure in this state, insulating adhesive layers 12, 22 formed on the surfaces of cover film 21 and base film 11 soften by heat and thus softened insulating adhesive layers 12, 22 are bonded together by pressure. During then, grooves 57 between wiring members 32 are filled with softened insulating adhesive layers 12, 22.

Figure 2F:
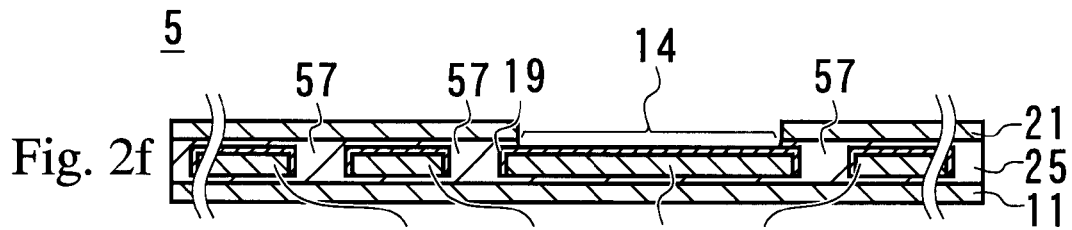
FIGS. 2(*f*)–(*i*) is a sectional view for illustrating the remaining half of the manufacturing process of a wiring board according to one embodiment of the present invention.
Figure 2G:
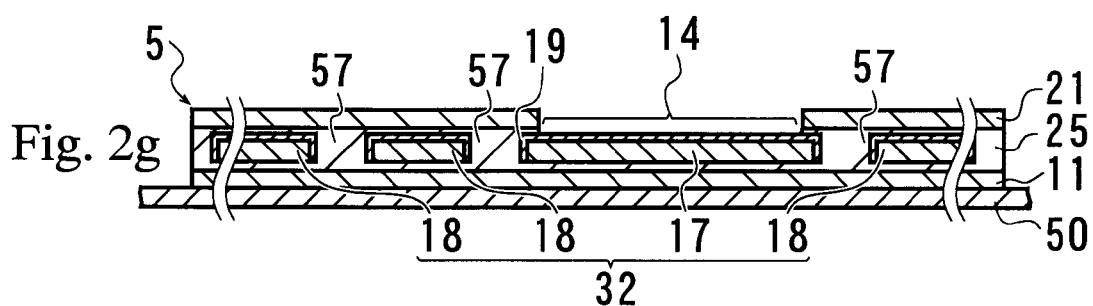
Figure 2H:
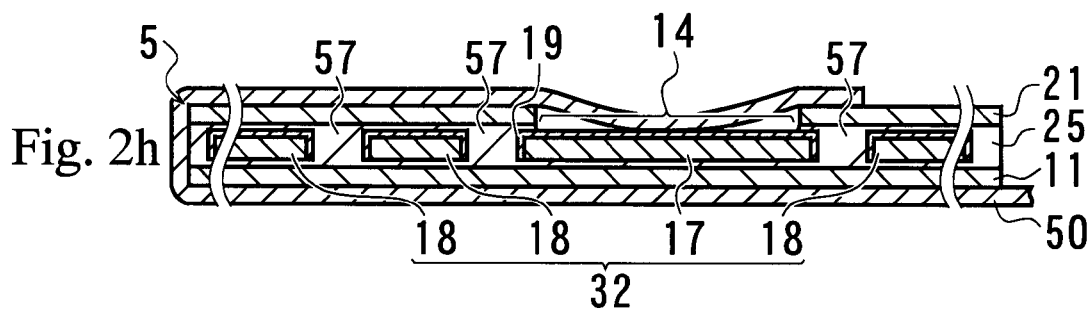
Figure 2I:
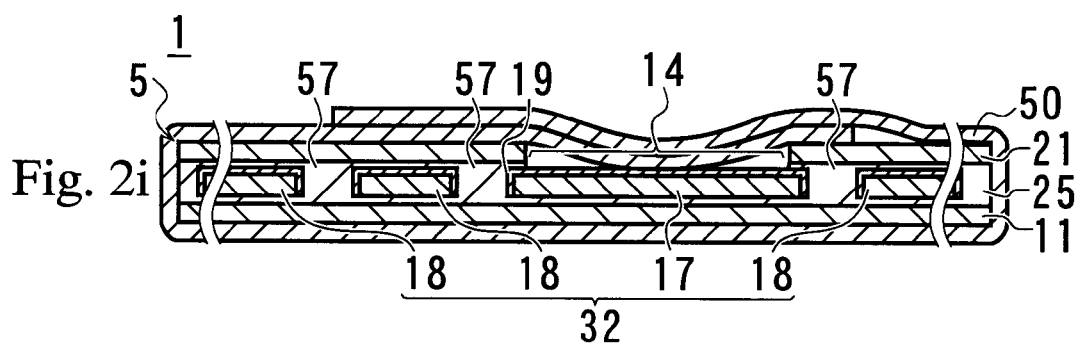

Then, the assembly is cooled so that insulating adhesive layers 12, 22 bonded together solidify into one adhesive layer 25 and cover film 21 and base film 11 are bonded together via the adhesive layer 25 into an original substrate (FIG. 2(f)).

Figure 4:
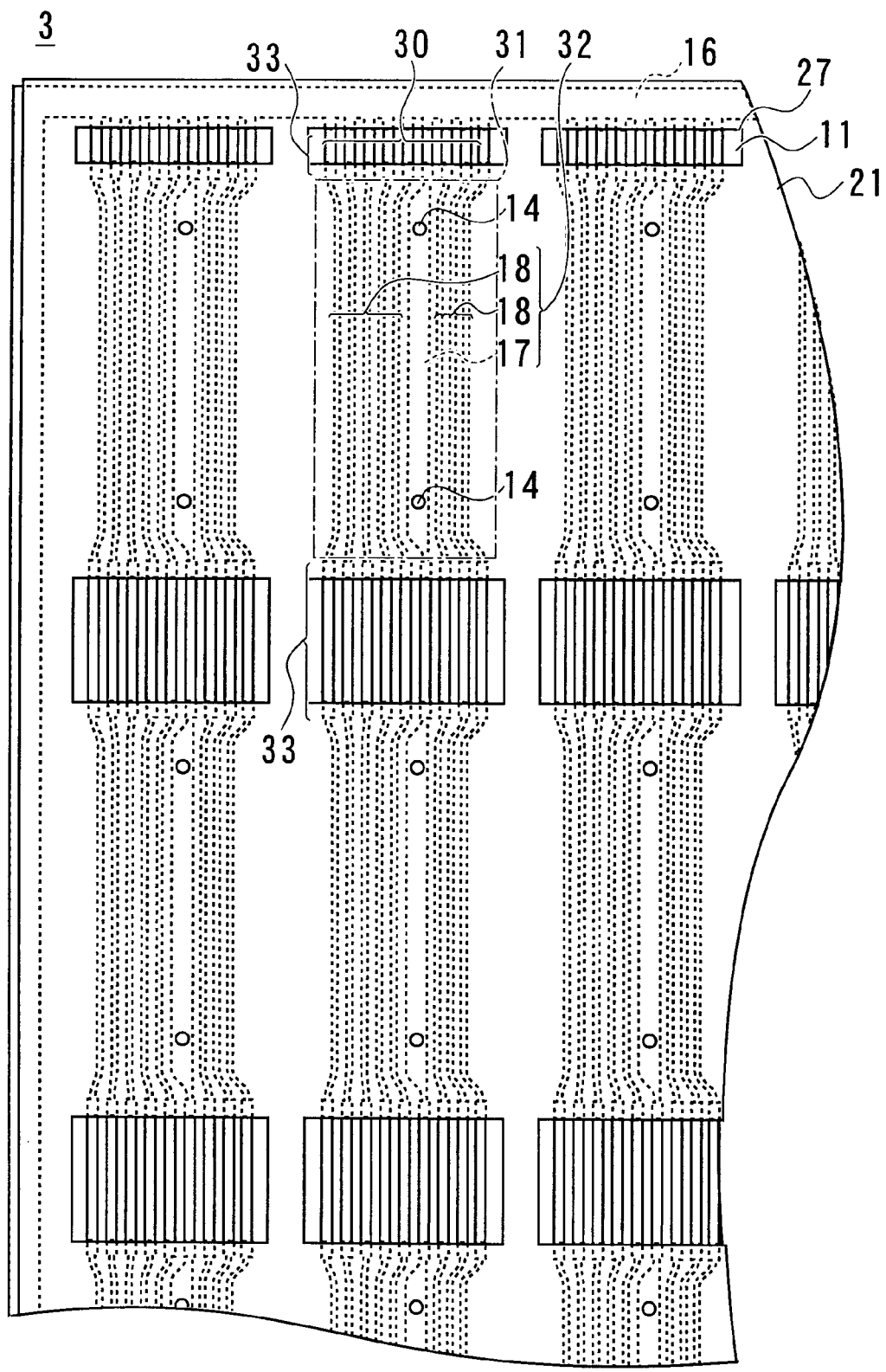
FIG. 4 is a plan view corresponding to FIG. 2(*f*).

Reference 3 in FIG. 4 represents an original substrate obtained by the process above, in which openings 14 in cover film 21 have a diameter smaller than the width of ground wiring 17 and openings 14 are located approximately at midpoints of the width of ground wiring 17 so that only metal coating 19 on the surface of ground wiring 17 is exposed at the bottoms of openings 14 in the state shown in FIG. 4.

On the other hand, windows 27 have a width larger than that of the region where connector members 33 interconnecting wiring sets 31 are located, so that connector members 33 and base film 11 surrounding connector members 33 are exposed at the bottoms of windows 27.

Figure 6:
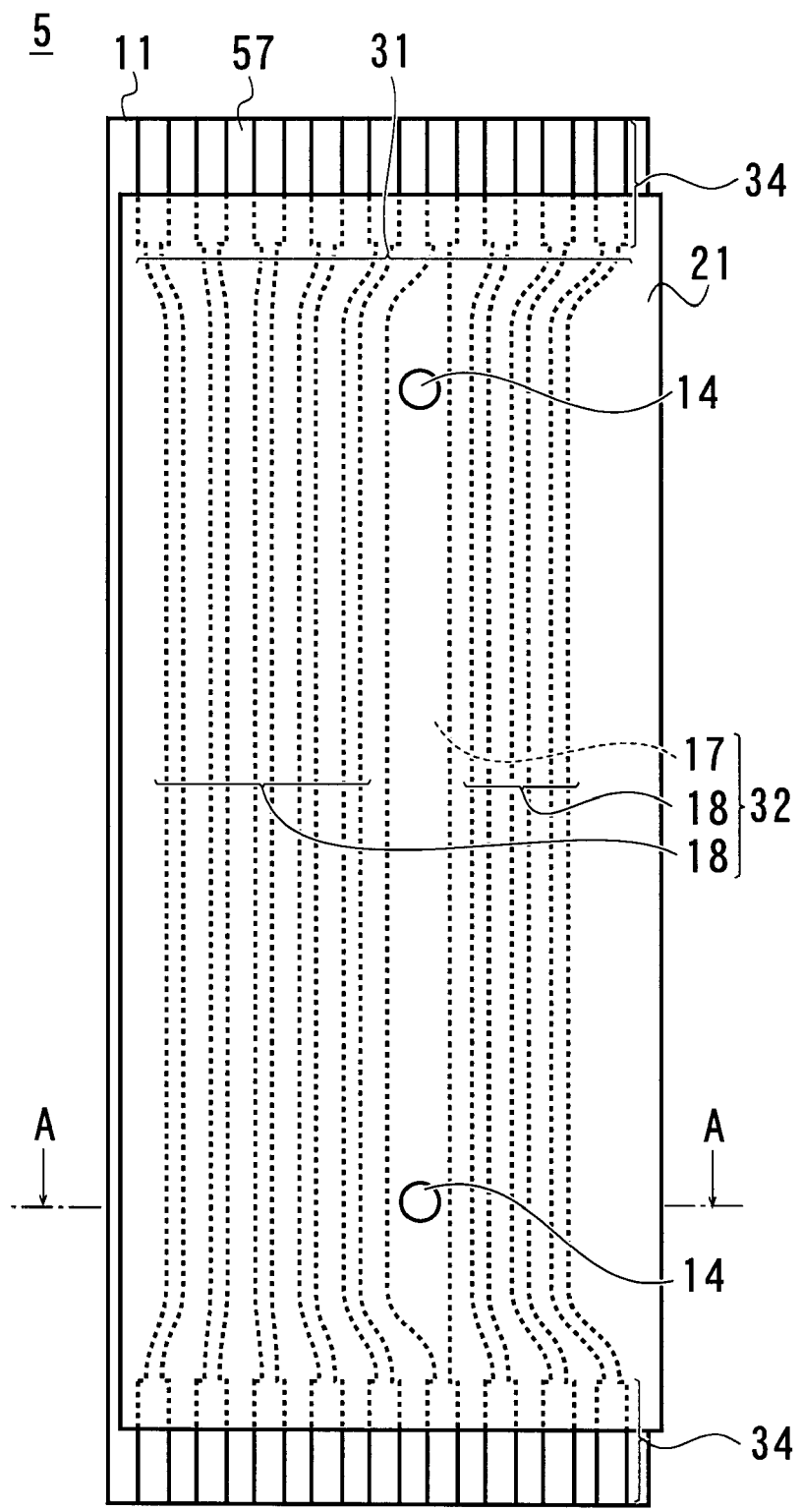
FIG. 6 is an enlarged plan view corresponding to FIG. 2(f).

Then, base film 11 and cover film 21 are cut to divide wiring sets 31 and connector members 33 exposed at the bottoms of windows 27 are also cut with base film 11 and cover film 21, whereby each wiring set 31 is separated to give a wiring board body 5 comprising a section of base film 11 and cover film 21 and one wiring set 31 as shown in FIG. 6.

The length of ground wiring 17 and signal wirings 18 forming wiring set 31, i.e., the length of wiring set 31 is larger than the width, while base film 11 has a width larger than the width of wiring set 31.

Wiring members 32 of separated wiring set 31 are connected to the separated connector members 33 at both ends and the separated connector members 33 form terminal members 34 of wiring board body 5. Each terminal member 34 extends beyond cover film 21 at both ends of wiring board body 5 to expose its surface. The length of base film is equal to a total length of wiring member 31 and lengths of terminal members 34 positioned at both ends of wiring member 31.

Next, a process for winding a shield film around the wiring board body 5 is explained.

Figure 11:
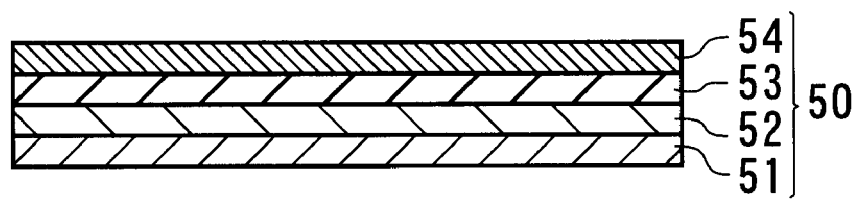
FIG. 11 is a sectional view for illustrating a shield film used in a wiring board of the present invention.

FIG. 11 shows a sectional view of a rectangular shield film 50 used in the present invention, which comprises a resin film 51 made of polyethylene terephthalate, a flame-retardant adhesive layer 52, a conductor layer 53 comprising a metal thin film and a conductive adhesive layer 54 stacked in the order mentioned to form a rectangular assembly.

Figure 7:
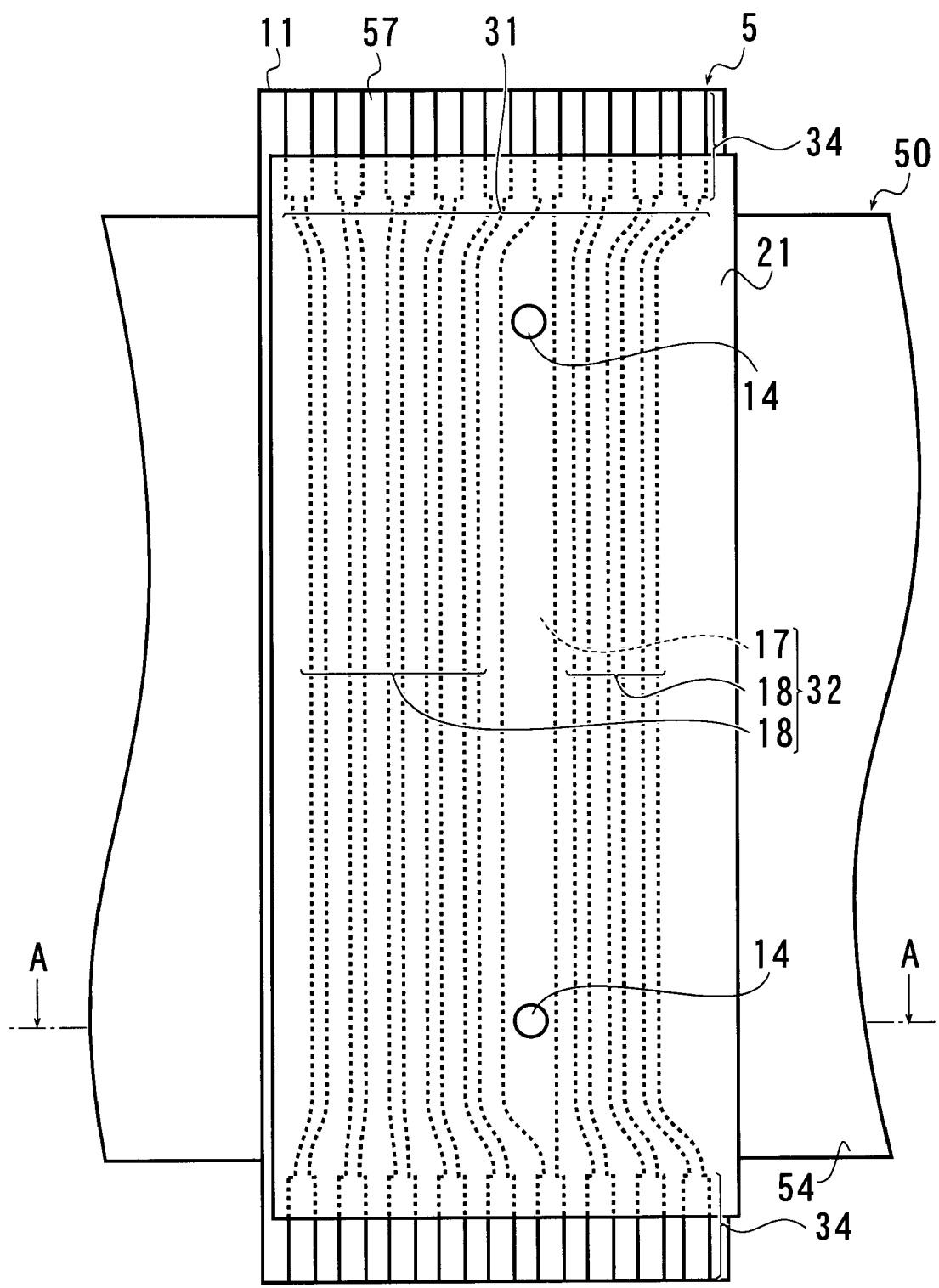
FIG. 7 is an enlarged plan view corresponding to FIG. 2(g).

The width of shield film 50 is equal to or smaller than the length of cover film 21 of wiring board body 5 in the direction along ground wiring 17 and signal wirings 18, and shield film 50 and wiring board body 5 face each other in such a manner that conductive adhesive layer 54 faces base film 11 and the width direction of shield film 50 is oriented in the longitudinal direction of cover film, and then, base film 11 of wiring board body 5 is brought into close contact with conductive adhesive layer 54 of shield film 50 as shown in FIG. 7.

Shield film 50 has a length double or more the width of wiring board body 5, so that shield film 50 extends beyond both ends of wiring board body 5 when wiring board body 5 is centered in the longitudinal direction of shield film 50.

In this state, shield film 50 and wiring board body 5 form a cross and the parts of base film 11 where terminal members 34 are located extend beyond both lateral sides of shield film 50.

Then, one of the ends of shield film 50 extending beyond wiring board body 5 is folded on cover film 21 of wiring board body 5 to bring conductive adhesive layer 54 of shield film 50 into close contact with the surface of cover film 21.

Figure 8:
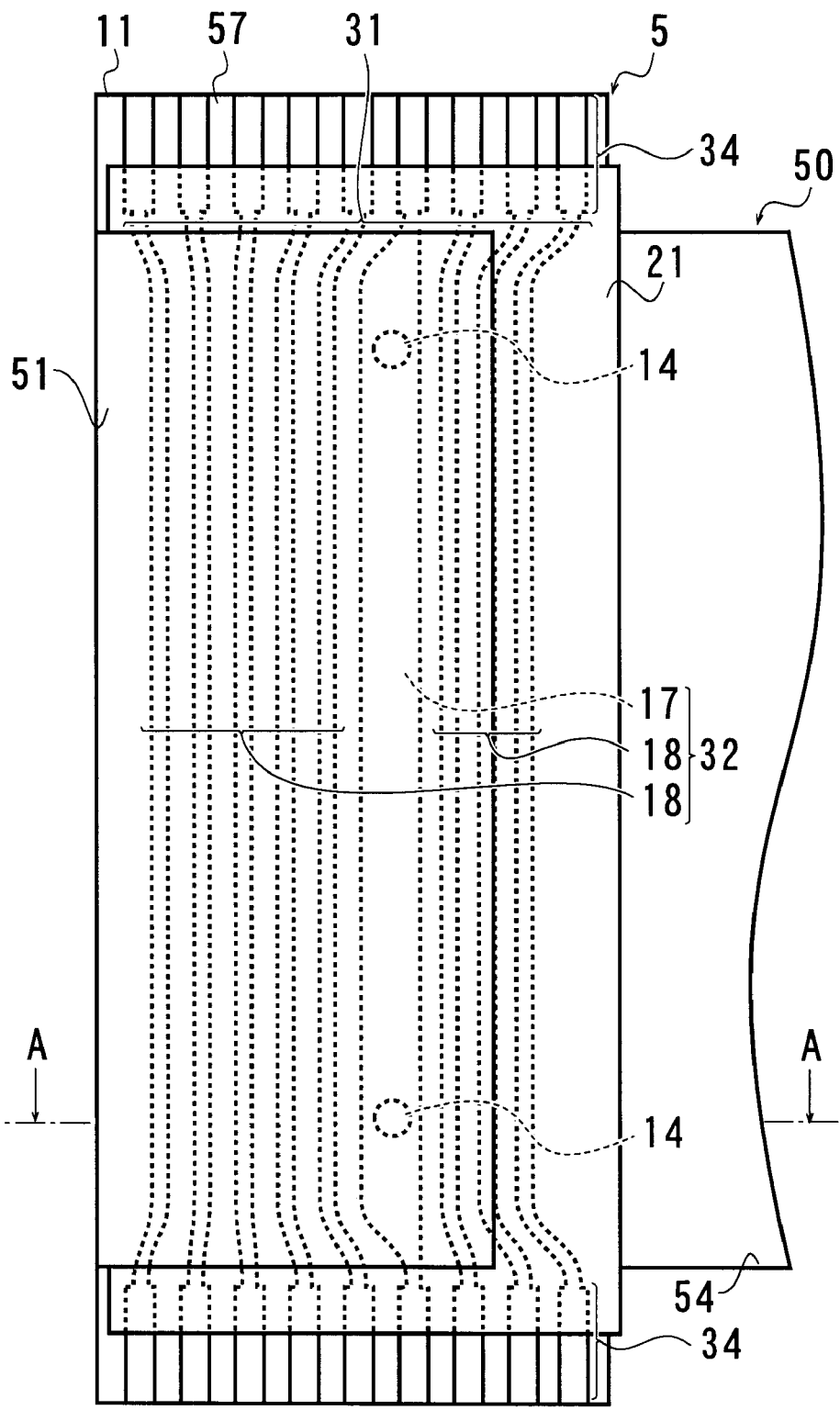
FIG. 8 is an enlarged plan view corresponding to FIG. 2(h).

FIG. 8 shows a plan view of this state and FIG. 2(*h*) shows a sectional view along A—A line of FIG. 8. In this state, metal coating 19 on the surface of ground wiring 17 and conductive adhesive layer 54 of shield film 50 are in contact with each other at the bottom of openings 14 in cover film 21.

Then, the other end is folded on cover film 21 in the same manner as the one end of shield film 50, whereby the surface of conductive adhesive layer 54 comes into close contact with the surface of cover film 21 and the surface of shield film 50 closely applied on the surface of cover film 21.

When the assembly is then heated under pressure and then cooled, shield film 50 is bonded to both sides of wiring board body 5 via conductive adhesive layer 54 to give a wiring board comprising wiring board body 5 and shield film 50 wrapped around wiring board body 5.

Figure 9:
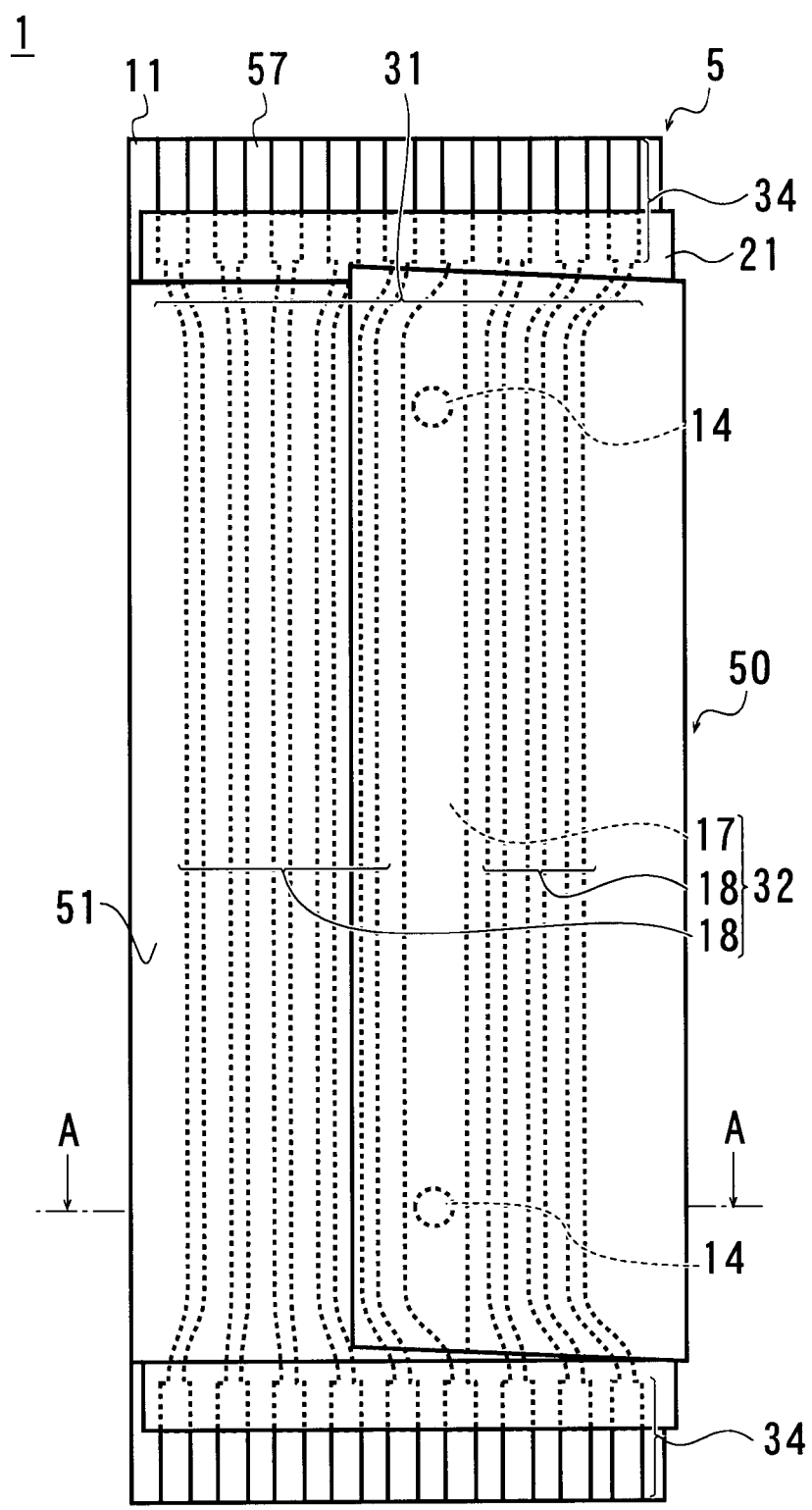
FIG. 9 is an enlarged plan view corresponding to FIG. 2(i).

Reference 1 in FIG. 9 represents a wiring board obtained by the process above, and FIG. 2(*i*) shows a sectional view along A—A line of FIG. 9.

Shield film 50 is wrapped around wiring board body 5 in such a manner that metal coating 19 on the surface of ground wiring 17 located at the bottoms of openings 14 is in close contact with the side of shield film 50 on which conductive adhesive layer 54 is formed, and conductor layer 53 of shield film 50 and ground wiring 17 of wiring board body 5 are electrically connected via the conductive adhesive layer 54.

As both ends of cover film 21 extend beyond shield film 50, the parts of terminal members 34 of wiring board body 5 extended from cover film 21 are exposed on base film 11 without contact with shield film 50.

Such a wiring board 1 is used in electronic devices, in which terminal member 34 at one end of wiring board 1 is connected to one circuit and terminal member 34 at the other end is connected to another electronic circuit to electrically connect both electronic circuits.

During then, terminal members 34 connected at both ends of signal wirings 18 are connected to signal I/O terminals of the electronic circuits and used for transmitting signals, while terminal members 34 connected at both ends of ground wiring 17 are connected to ground terminals of the electronic circuits and placed at ground potential.

As a result, shield film 50 connected to ground wiring 17 at the bottoms of openings 14 is wholly placed at ground potential, which means that not only the side on which shield film 50 and ground wiring 17 are connected, i.e., the side of cover film 21 but also the side of base film 11 is placed at ground potential, whereby electromagnetic noise is shut out from signal wirings 18.

Although the foregoing embodiment relates to wiring board 1 having wiring set 31 formed on one side of base film 11, the present invention is not limited thereto.

Figure 12:
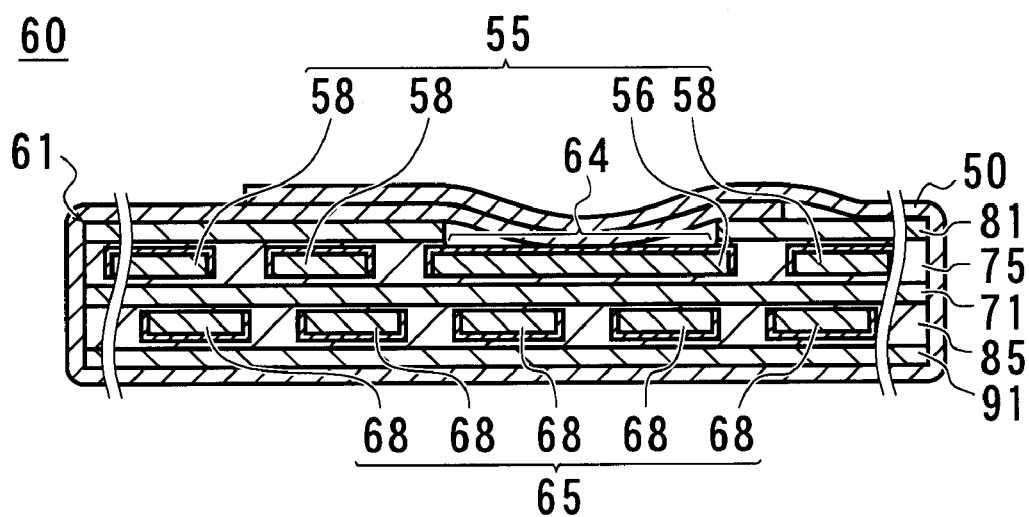
FIG. 12 is a sectional view for illustrating a wiring board according to another embodiment of the present invention.
Figure 13:
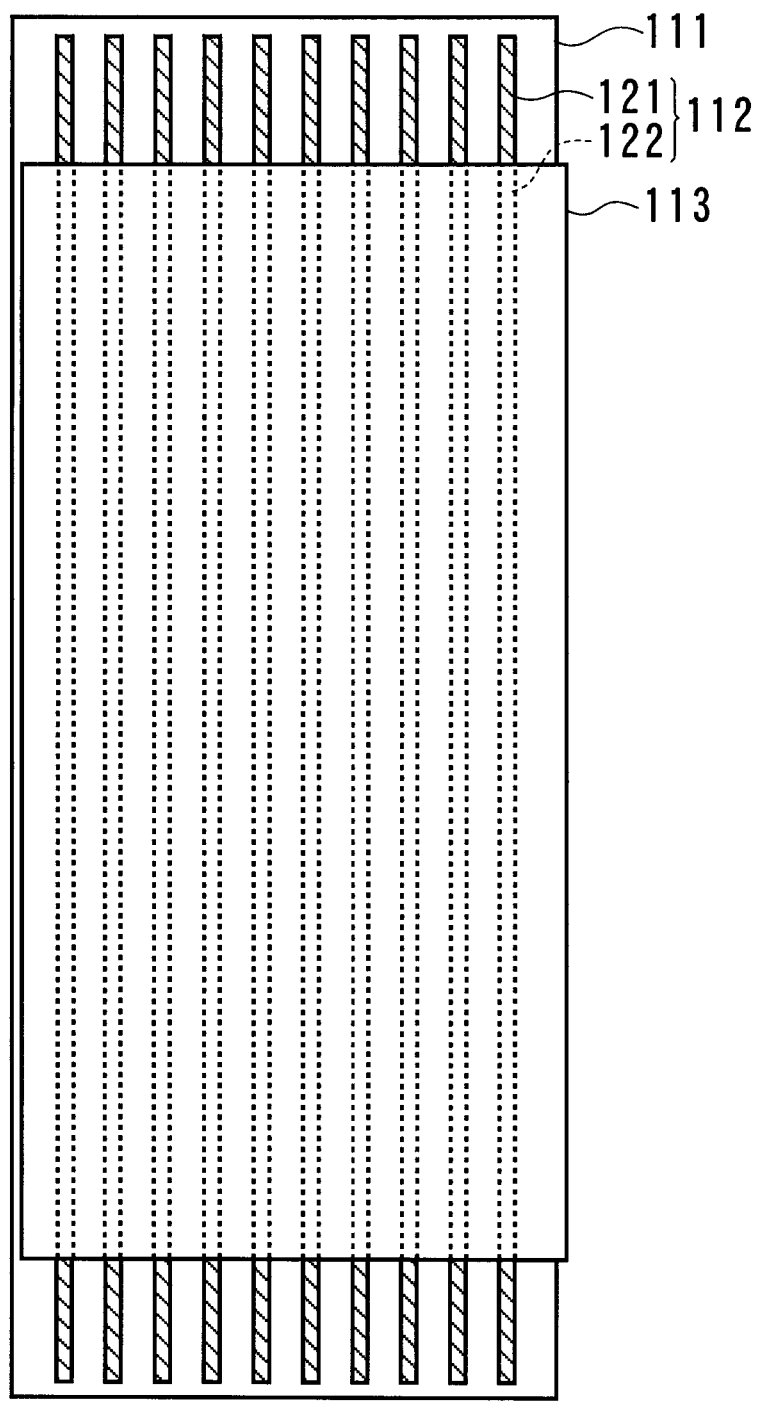
FIG. 13 is a diagram for illustrating a wiring board of the prior art.

FIG. 12 shows a sectional view of wiring board 60 according to another embodiment of the present invention. The wiring board 60 comprises a wiring board body 61 and a shield film 50 wrapped to cover both sides of wiring board body 61.

The wiring board body 61 comprises a base film 71 and wiring sets 55, 65 respectively on both sides of base film 71, and cover films 81, 91 are respectively applied on wiring sets 55, 65 via adhesive layers 75, 85 comprising an insulating adhesive.

Of these wiring sets 55, 65, wiring set 65 formed on one side of base film 71 has a plurality of signal wirings 68 while wiring set 55 formed on the other side has at least one ground wiring 56 and a plurality of signal wirings 58. Here are shown five signal wirings 68 on one surface of base film 71 and one ground wiring 56 and three signal wirings 58 on the other surface.

In these wiring sets 55, 65, cover film 81 applied on ground wiring 56 has openings 64 having a diameter smaller than the width of ground wiring 56 and the openings 64 overlie ground wiring 56 to expose ground wiring 56 at the bottoms of openings 64.

Shield film 50 has the same structure as shown in FIG. 11. The shield film 50 is wrapped around wiring board body 61 in such a manner that the side of shield film 50 on which conductive adhesive layer 54 is formed is in close contact with cover films 81 and 91. Shield film 50 and ground wiring 56 are electrically connected at the bottoms of openings 64 in cover film 81, whereby shield film 50 can be wholly placed at ground potential to shield wiring board 60 from electromagnetic noise.

Base films 11, 71, wiring sets 31, 56, 65, cover films 21, 81, 91 and adhesive layers 25, 75, 85 forming wiring board bodies 5, 61 of wiring board 1 according to one embodiment of the present invention and wiring board 60 according to another embodiment of the present invention described above are flexible.

Resin film 51, flame-retardant adhesive layer 52, conductor layer 53 and conductive adhesive layer 54 forming shield film 50 are also flexible.

Therefore, wiring boards 1, 60 of the present invention are flexible so that they can be freely folded under the breaking load limit, whereby wiring boards 1, 60 of the present invention can be folded to connect electric circuits.

Although the foregoing embodiments relate to wiring boards in which a plurality of wirings are insulated from each other, the present invention also includes flexible wiring boards in which some wirings are connected each other and wiring boards formed by bonding a wiring board of the present invention to another wiring board.

Although the foregoing embodiments relate to the case in which each metal wiring 30 is formed of metal layer 13 consisting of a copper foil, the present invention is not limited thereto but these wirings may be formed of any conductive materials such as aluminium.

A shield film can be easily connected to a wiring board body, so that electromagnetic noise can be shut out from not only the side on which the shield film is connected to a ground wiring but also the opposite side.

What is claimed is:

1. A wiring board comprising a base film, a plurality of wiring members provided on the base film and bonded to the base film, a cover film provided on the wiring members, an opening formed in the cover film, and a shield film wrapped to cover both of the side of the base film and the side of the cover film, the wiring members includes a ground wiring and a signal wirings, a terminal member is connected at each end of the ground wiring and each end of each of the signal wirings, the terminal member has a width smaller than a width of the ground wiring but larger than a width of the signal wirings, the opening is arranged to expose the surface of the ground wiring but not expose the surfaces of the signal wirings, and shield film is connected to the ground wiring at the bottom of the opening.

2. The wiring board of claim 1 wherein at least a part of the terminal member is exposed from the cover film, and the shield film does not come into contact with the exposed part of the terminal member.

3. The wiring board of claim 1 wherein the shield film comprises a resin film, a conductor layer provided on the resin film and a conductive adhesive layer provided on the surface of the conductor layer and the conductive adhesive layer is in close contact with the surface of the cover film and the surface of the base film.

4. The wiring board of claim 2 wherein the shield film comprises a resin film, a conductor layer provided on the resin film and a conductive adhesive layer provided on the surface of the conductor layer and the conductive adhesive layer is in close contact with the surface of the cover film and the surface of the base film.

5. A process for manufacturing a wiring board comprising:

forming metal wirings by patterning a metal layer on a base film in a predetermined shape so as to have a ground wiring, signal wirings and connector members each having a width smaller than a width of the ground wiring but larger than a width of each of the signal wirings, connected at each end of the ground wiring and each end of the signal wirings, providing a cover film having an opening on the metal wirings in such a manner that the opening overlies the ground wiring, and wrapping a shield film from the side of the base film to the side of the cover film.

6. The process of claim 5 further comprising providing a plurality of wiring sets comprising the metal wirings on a predetermined region of the base film, forming the opening in the number equal to or greater than the number of the wiring sets in the cover film in such a manner that at least one opening overlies the each wiring set, and then cutting the base film and the cover film to separate the wiring sets.

* * * * *